United States Patent
Nakazawa et al.

(10) Patent No.: US 7,705,371 B2
(45) Date of Patent: Apr. 27, 2010

(54) FIELD EFFECT TRANSISTOR HAVING REDUCED CONTACT RESISTANCE AND METHOD FOR FABRICATING THE SAME

(75) Inventors: Satoshi Nakazawa, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 387 days.

(21) Appl. No.: 11/730,615

(22) Filed: Apr. 3, 2007

(65) Prior Publication Data

US 2007/0278507 A1 Dec. 6, 2007

(30) Foreign Application Priority Data

May 31, 2006 (JP) .............................. 2006-151051

(51) Int. Cl.
*H01L 29/772* (2006.01)
(52) U.S. Cl. ............... 257/192; 257/284; 257/E29.091; 257/E29.249
(58) Field of Classification Search ........... 257/E29.249
See application file for complete search history.

(56) References Cited

U.S. PATENT DOCUMENTS

| 7,217,960 B2* | 5/2007 | Ueno et al. ................. 257/103 |
| 2004/0079959 A1* | 4/2004 | Udagawa .................... 257/103 |
| 2005/0006664 A1* | 1/2005 | Inoue et al. ................. 257/192 |
| 2006/0180831 A1* | 8/2006 | Nakazawa et al. .......... 257/189 |
| 2006/0281284 A1* | 12/2006 | Harris et al. ............... 438/478 |

OTHER PUBLICATIONS

T. Murata et al., "Source Resistance Reduction of AlGaN-GaN HFETs with Novel Superlaftice Cap Layer," IEEE Transactions on Electron Devices, vol. 52, pp. 1042-1047, 2005.

* cited by examiner

*Primary Examiner*—Stephen W Smoot
(74) *Attorney, Agent, or Firm*—McDermott Will & Emery LLP (57) ABSTRACT

A field effect transistor includes a nitride semiconductor layered structure that is formed on a substrate and includes a capping layer made of a compound represented by a general formula of $In_xAl_yGa_{1-y}N$ (wherein $0<x\leq 1$, $0\leq y<1$ and $0<x+y\leq 1$). A non-alloy source electrode and a non-alloy drain electrode are formed on the capping layer so as to be spaced from each other.

8 Claims, 7 Drawing Sheets

FIELD EFFECT TRANSISTOR HAVING REDUCED CONTACT RESISTANCE AND METHOD FOR FABRICATING THE SAME

CROSS-REFERENCE TO RELATED APPLICATIONS

This application claims priority under 35 U.S.C. 119 on Patent Application No. 2006-151051 filed in Japan on May 31, 2006, the entire contents of which are hereby incorporated by reference.

BACKGROUND OF THE INVENTION

The present invention relates to a field effect transistor and a method for fabricating the same, and more particularly, it relates to a field effect transistor usable as a high-power radio-frequency transistor and a method for fabricating the same.

Group III-V nitride compound semiconductors, which are typified by gallium nitride (GaN), are represented by a general formula of $In_xAl_yGa_{1-x-y}N$ (wherein $0 \leq x \leq 1$ and $0 \leq y \leq 1$), have a wide band gap and a large breakdown field, and hence are regarded as promising materials for high-power electronic devices. In particular, in a heterojunction structure in which aluminum gallium nitride (AlGaN) is stacked on gallium nitride (GaN), a strong electric field is caused by polarization on the (0001) plane. Therefore, electrons are accumulated in a high density in the vicinity of the heterojunction interface in the GaN film, so as to generate the so-called two-dimensional electron gas (2DEG). Since the 2DEG is generated in the undoped GaN film, it is not affected by impurity scattering, and hence it exhibits high electron mobility. In addition, a GaN-based material exhibits high saturated drift velocity, and for example, in a high electric field region of approximately $1 \times 10^5$ V/cm, electronic velocity is twice or more as large as that of a GaAs-based material which prevails as a material for a radio-frequency transistor. Furthermore, the breakdown voltage of a GaN-based transistor can be easily increased owing to the high breakdown field of GaN. Therefore, the GaN-based material is expected to be applied to a high-power radio-frequency transistor.

In a heterojunction field effect transistor (HFET), in order to improve the radio-frequency characteristics, it is necessary to a reduce parasitic resistance, particularly, a parasitic resistance what is called a source resistance between an ohmic electrode and the 2DEG. Therefore, it is examined to reduce the source resistance, for example, by employing a recess structure in which a low-resistant capping layer is placed between an ohmic electrode and a underlying heterojunction structure. For example, it has been reported that the source resistance is reduced and the radio-frequency characteristics are improved by employing a multilayered structure for a capping layer, in which thin layers of GaN and AlGaN are alternately stacked (see, for example, T. Murata et al., IEEE Transactions on Electron Devices, 2005, vol. 52, pp. 1042-1047).

However, a conventional GaN-based transistors has the following problems: An ohmic electrode formed on a capping layer generally consists of a layered structure of titanium (Ti) and aluminum (Al). In order to reduce the contact resistance of the ohmic electrode which consists of the layered structure of Ti and Al, it is necessary to perform annealing designated as alloy processing after forming the electrode. Therefore, the process for forming the electrode is disadvantageously complicated. Also, the characteristics of the device are disadvantageously degraded because a semiconductor layer is thermally denatured or the electrode material is diffused into the semiconductor layer during the alloy processing.

Furthermore, in order to form an ohmic electrode with small contact resistance on an n-type semiconductor layer, it is necessary to use a metal with a small work function. On the other hand, in order to form a Schottky electrode with good Schottky characteristics, it is necessary to use a metal with a large work function. Therefore, a source electrode and a drain electrode should be made of a different material from that used for a gate electrode. For example, in general, a layered structure of titanium (Ti) and aluminum (Al) is used for a source electrode and a drain electrode with nickel (Ni) used for a gate electrode. Therefore, the gate electrode cannot be formed simultaneously with the source electrode and the drain electrode, which makes the process for forming the electrodes complicated.

SUMMARY OF THE INVENTION

The present invention was devised to solve the aforementioned problems, and an object of the invention is realizing a field effect transistor in which contact resistance of a source electrode and a drain electrode is reduced without performing the alloy processing and the electrodes can be easily formed.

In order to achieve the object, the field effect transistor of this invention includes a capping layer made of InAlGaN.

Specifically, the field effect transistor of this invention includes a layered structure of nitride semiconductors formed on a substrate and including a capping layer made of a compound represented by a general formula of $In_xAl_yGa_{1-y}N$ (wherein $0<x \leq 1$, $0 \leq y<1$ and $0<x+y \leq 1$); and a non-alloy source electrode and a non-alloy drain electrode formed on the capping layer to be spaced from each other.

Since the field effect transistor of this invention includes the capping layer made of the compound represented by a general formula of $In_xAl_yGa_{1-y}N$ (wherein $0<x \leq 1$, $0 \leq y<1$ and $0<x+y \leq 1$), the Schottky barrier height of a metal can be reduced owing to the large electron affinity of InAlGaN. Accordingly, an electrode with good ohmic characteristics can be realized without performing annealing after forming the electrode, and hence, a non-alloy electrode not subjected to the annealing can be used as an ohmic electrode. Furthermore, since a metal with a large work function can be used for the source electrode and the drain electrode, the ohmic electrodes may be made of the same material as a gate electrode. As a result, the ohmic electrodes and the gate electrode can be simultaneously formed, so as to simplify the fabrication process for the field effect transistor.

In the field effect transistor of this invention, the layered structure of nitride semiconductors preferably includes an electron supplying layer formed under the capping layer, the capping layer preferably has an opening formed in a region between the source electrode and the drain electrode for exposing the electron supplying layer therein, and the field effect transistor preferably further includes a gate electrode formed on a portion of the electron supplying layer exposed in the opening.

In this case, the gate electrode, the source electrode and the drain electrode are preferably made of the same material. Thus, the ohmic electrodes and the gate electrode can be simultaneously formed, so as to simplify the fabrication process for the field effect transistor.

The field effect transistor of the invention preferably further includes an insulating film formed between the gate electrode and the electron supplying layer. Thus, a leakage current can be suppressed on the gate electrode, and hence, device characteristics including radio-frequency characteristics can be improved.

In the field effect transistor of tie invention, the layered structure of nitride semiconductors preferably includes a multilayered film that is formed between the capping layer and the electron supplying layer and includes gallium nitride and aluminum gallium nitride alternately stacked.

In the field effect transistor of the invention, the capping layer preferably includes indium, aluminum and gallium in a ratio which satisfies a lattice-matching condition with gallium nitride. Thus, the crystallinity of the capping layer can be improved, so as to reduce parasitic resistance. Accordingly, while realizing good device characteristics, the fabrication process can be simplified so as to lower the fabrication cost.

In this case, a value extracted from a ratio of aluminum in the capping layer divided by a ratio of indium in the capping layer is preferably not smaller than 3.6 and not larger than 4.7. Thus, the crystallinity of the capping layer can be definitely improved.

In the field effect transistor of the invention, each of the source electrode and the drain electrode is preferably made of a layered structure including at least one of or two or more of aluminum, titanium, molybdenum, copper and palladium.

In the field effect transistor of the invention, each of the source electrode and the drain electrode preferably has contact resistance of $1 \times 10^{-4}$ $\Omega cm^2$ or less. Thus, the parasitic resistance can be reduced, so as to improve the device characteristics including the radio-frequency characteristic.

In the field effect transistor of the invention, the capping layer preferably includes an impurity in a concentration of $1 \times 10^{19}$ $cm^{-3}$ or more. Thus, the parasitic resistance can be reduced, so as to improve the device characteristics including the radio-frequency characteristics.

The method for fabricating a field effect transistor of this invention includes the steps of (a) successively forming, on a substrate, a first nitride semiconductor layer, a second nitride semiconductor layer having a wider band gap than the first nitride semiconductor layer and a capping layer made of a compound represented by a general formula of $In_xAl_yGa_{1-y}N$ (wherein $0<x\leq 1$, $0\leq y<1$ and $0<x+y\leq 1$); and (b) forming a source electrode and a drain electrode on the capping layer to be spaced from each other, and the source electrode and the drain electrode are formed without performing annealing in the step (b).

Since the method for fabricating a field effect transistor of this invention includes the step of forming the capping layer made of the compound represented by a general formula of $In_xAl_yGa_{1-y}N$ (wherein $0<x\leq 1$, $0\leq y<1$ and $0<x+y\leq 1$), the Schottky barrier height of a metal can be reduced owing to the large electron affinity of InAlGaN. Accordingly, a metal with a large work function can be used for the source electrode and the drain electrode, and hence, ohmic electrodes may be made of the same material as a gate electrode. Also, since the ohmic electrodes are formed without performing annealing, the fabrication process can be simplified as well as degradation of device characteristics otherwise caused by the interdiffusion and the interfacial reaction of the materials can be prevented.

The method for fabricating a field effect transistor of this invention preferably further includes, after the step (a) and before the step (b), a step (c) of forming an opening in the capping layer for exposing the second nitride semiconductor layer therein, and the step (b) includes a sub-step of forming a gate electrode on a portion of the second nitride semiconductor layer exposed in the opening.

In this case, the gate electrode, the source electrode and the drain electrode are preferably simultaneously formed by using the same material.

The method for fabricating a field effect transistor of the invention preferably further includes, after the step (c) and before the step (b), a step (d) of forming an insulating film at least on the portion of the second nitride semiconductor layer exposed in the opening.

In the method for fabricating a field effect transistor of the invention, the step (c) preferably includes a sub-step of reducing a thickness of the second nitride semiconductor layer in the portion thereof exposed in the opening as compared with the other portion thereof, and the insulating film preferably has a thickness smaller than a thickness difference of the second nitride semiconductor layer between the portion thereof exposed in the opening and the other portion thereof. Thus, the gate electrode can be made sufficiently close to a channel of the field effect transistor, and hence, the device characteristics including the radio-frequency characteristics can be improved.

In the method for fabricating a field effect transistor of the invention, the step (a) preferably includes a sub-step of forming, between the second nitride semiconductor layer and the capping layer, a multilayered film by alternately stacking gallium nitride and aluminum gallium nitride.

In the method for fabricating a field effect transistor of the invention, the step (a) preferably includes a sub-step of introducing an n-type impurity into the capping layer, and the n-type impurity is preferably introduced in such a manner that a concentration thereof is higher in an upper portion of the capping layer than in a lower portion thereof.

DETAILED DESCRIPTION OF THE INVENTION

Embodiment 1

Figure 1:
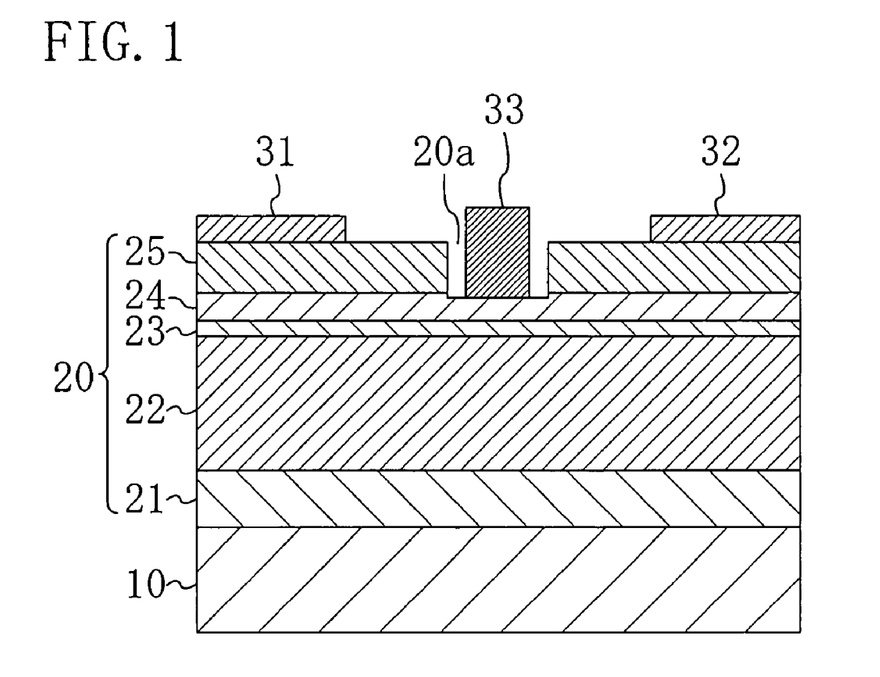
FIG. 1 is a cross-sectional view of a field effect transistor according to Embodiment 1 of the invention.

Embodiment 1 of the invention will now be described with reference to the accompanying drawings. FIG. 1 shows the cross-sectional structure of a field effect transistor (FET) according to Embodiment 1 of the invention. As shown in FIG. 1, the FET of this embodiment includes a layered structure of nitride semiconductors 20 that is formed on a substrate 10 of sapphire and includes a capping layer made of indium aluminum gallium nitride (InAlGaN). A source electrode 31 and a drain electrode 32 each made of a layered structure of titanium (Ti) and aluminum (Al) formed on the layered structure of nitride semiconductors 20 and a gate electrode 33 made of palladium (Pd) are formed on the nitride semiconductor layered structure 20.

The layered structure of nitride semiconductors 20 includes an AlN buffer layer 21 made of aluminum nitride (AlN) with a thickness of 0.5 μm, a GaN buffer layer 22 made of GaN with a thickness of 2 μm, a spacer layer 23 made of AlN with a thickness of 1 nm, an electron supplying layer 24 made of n-type aluminum gallium nitride (AlGaN) with a thickness of 25 nm, and a capping layer 25 made of n-type indium aluminum gallium nitride (InAlGaN) with a thickness of 50 nm, all of which are successively formed on the substrate 10. In this embodiment, it is assumed that the ratios of components of the aluminum gallium nitride and the indium aluminum gallium nitride are respectively $Al_{026}Ga_{0.74}N$ and $In_{0.09}Al_{0.32}Ga_{0.59}N$.

The n-type layers are doped with silicon (Si), that is, an n-type impurity, and the impurity concentration is $4 \times 10^{18}$ $cm^{-3}$ in the electron supplying layer 24 and $1 \times 10^{19}$ $cm^{-3}$ in the capping layer 25. Also, a heterojunction interface is formed between the GaN buffer layer 22 and the spacer layer 23, and a two-dimensional electron gas (2DEG) functioning as a channel of the FET is generated in a portion of the GaN buffer layer 22 in the vicinity of the interface with the spacer layer 23.

The capping layer 25 has a gate recess 20a corresponding to an opening for exposing the electron supplying layer 24 therein, and the gate electrode 33 made of Pd is formed on the exposed portion of the electron supplying layer 24 in the gate recess 20a. The source electrode 31 and the drain electrode 32 are formed on the capping layer 25 so as to have the gate electrode 33 disposed therebetween.

The capping layer 25 of this embodiment is made of $In_{0.09}Al_{0.32}Ga_{0.59}N$ and is lattice-matched with GaN. Also, the electron supplying layer 24 is made of $Al_{0.26}Ga_{0.74}N$, and the polarization of the electron supplying layer 24 substantially matches with that of the capping layer 25. Therefore, interfacial charge derived from a polarization difference is not generated on the heterojunction interface between the capping layer 25 and the electron supplying layer 24. Accordingly, depletion of electrons is not caused, so that parasitic resistance can be reduced on the heterojunction interface.

Although the capping layer 25 is made of $In_{0.09}Al_{0.32}Ga_{0.59}N$ in this embodiment, In, Al and Ga may be included in any ratio as far as the resultant composition matches in the lattice with GaN so as to sufficiently suppress crystal strain caused in the capping layer 25. Specifically, on the basis of the result of experimental examination and the concept that a lattice constant of InAlGaN is obtained by proportionally distributing lattice constants of InN, AlN and GaN in accordance with a ratio of components, a value Al/In extracted from dividing the ratio of Al by the ratio of In is not less than 3.6 and not more than 4.7.

Now, it will be described on the basis of the results of an experiment that a capping layer made of n-type InAlGaN exhibits a comparatively good ohmic characteristic against various metals having different work functions.

Figure 2A:
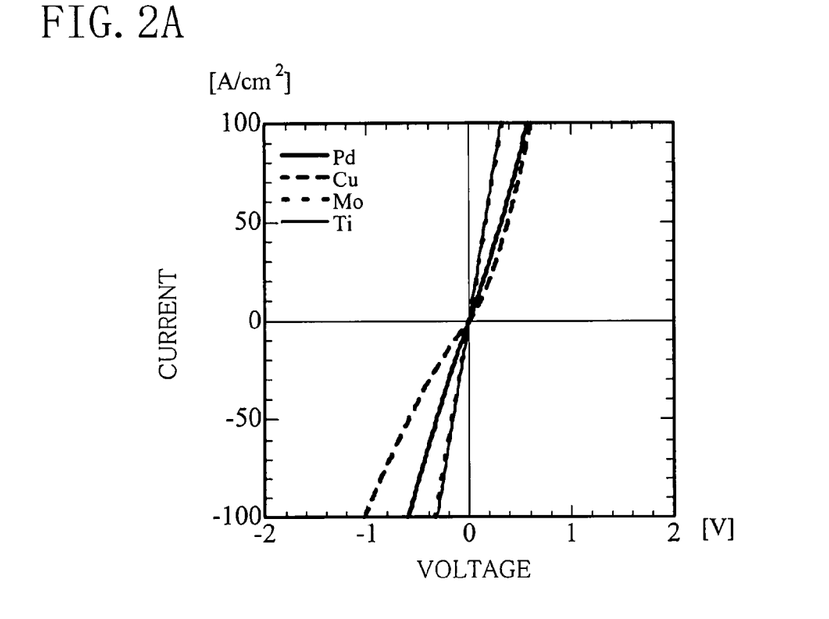
FIGS. 2A and 2B are graphs of current-voltage characteristics for comparing the characteristics of an ohmic electrode of the field effect transistor of Embodiment 1 with the characteristics of an ohmic electrode of a conventional field effect transistor.
Figure 2B:
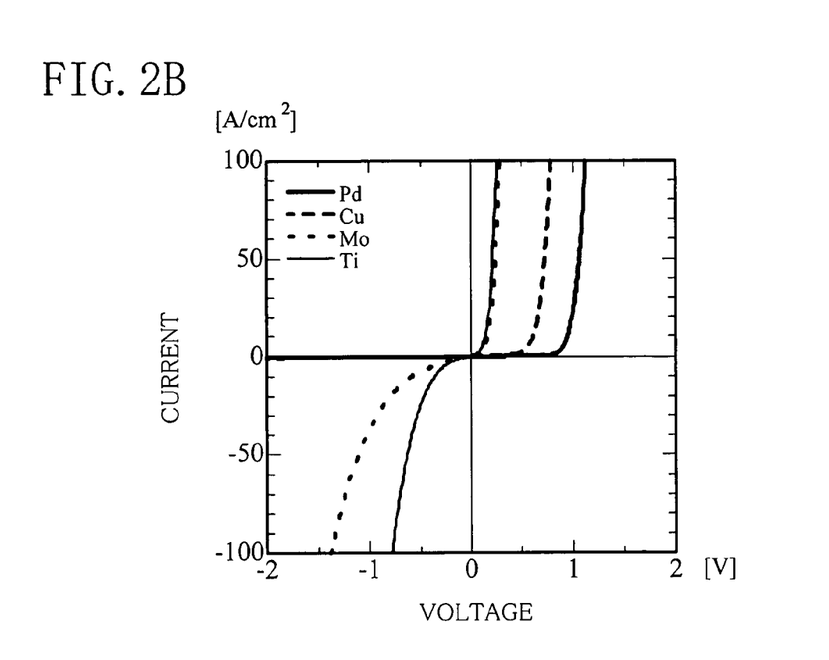

FIG. 2A shows current-voltage characteristics obtained by forming, on n-type $In_{0.09}Al_{0.32}Ga_{0.59}N$, a variety of metal electrodes, and FIG. 2B shows current-voltage characteristics obtained by forming, on n-type GaN, a variety of metal electrodes. It is noted that an electrode made of Ti and Al is separately formed on each of the n-type InAlGa and the n-type GaN so as to measure a current value with a voltage applied between the electrodes. Also, no annealing is performed after forming the electrodes.

As shown in FIG. 2B, when a metal electrode is formed on the n-type GaN, a Schottky barrier is generated and a Schottky diode is formed. In the case where a metal electrode is formed on the n-type InAlGaN, however, ohmic characteristics are obtained in all the metals used in the examination as shown in FIG. 2A.

Figure 3:
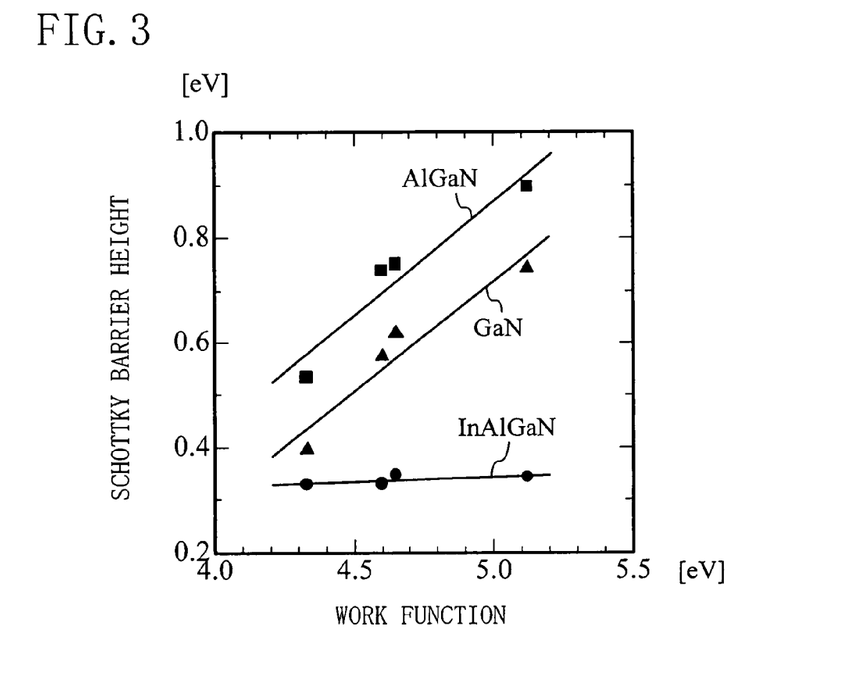
FIG. 3 is a graph for showing the correlation between a work function of an electrode material and a Schottky barrier height used for explaining the characteristics of the ohmic electrode of the field effect transistor of Embodiment 1.

FIG. 3 shows the Schottky barrier height extracted from current-voltage characteristics as a function of the work functions of metals used for the electrodes. As shown in FIG. 3, the Schottky barrier height increases according to the work functions of the metals used for the electrodes on $Al_{0.26}Ga_{0.74}N$ and GaN. On the other hand, the Schottky barrier height is substantially constant on $In_{0.09}Al_{0.32}Ga_{0.59}N$ and smaller than on AlGaN or GaN. As a result, it is obvious that an InAlGaN capping layer can realize good ohmic characteristics because of its large electron affinity and its low Schottky barrier height.

Figure 4:
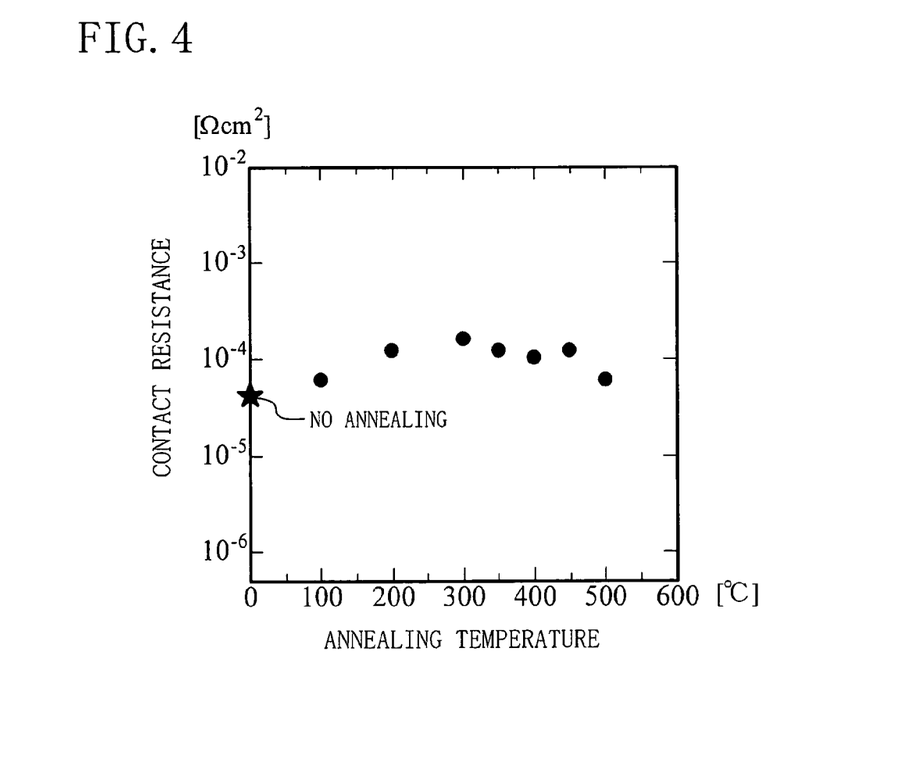
FIG. 4 is a graph for showing the correlation between an annealing temperature and contact resistance obtained in the field effect transistor of Embodiment 1.

Now, it is described on the basis of the experimental results that there is no need to perform the annealing (alloy processing) in using n-type InAlGaN as a capping layer. FIG. 4 shows the obtained contact resistance of Ti electrodes on InAlGaN as a function of the annealing temperature. As shown in FIG. 4, in the case where an ohmic electrode is formed on InAlGaN, comparatively low contact resistance at a level of $10^{-5}$ $\Omega cm^2$ is obtained no matter whether the alloy processing is performed or not. Accordingly, when InAlGaN is used as a capping layer, an electrode that does not need to be subjected to the annealing, namely, what is called a non-alloy ohmic electrode, can be realized.

Figure 5A:
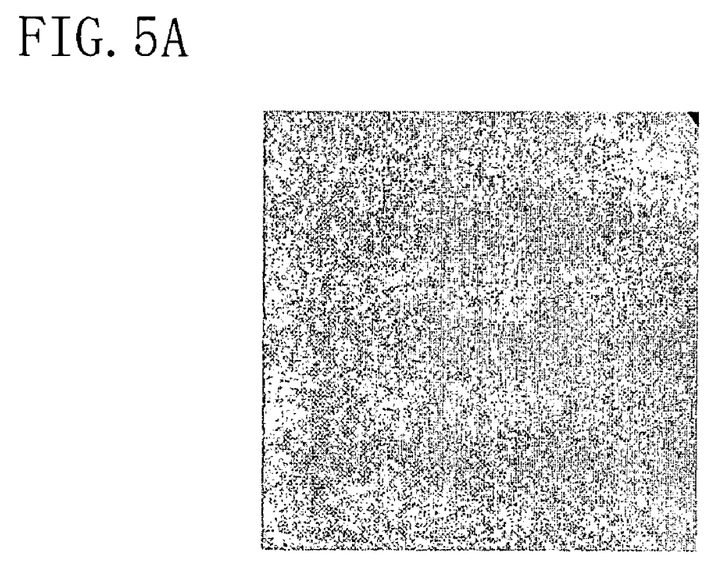
FIGS. 5A and 5B are microscope photographs respectively of the ohmic electrode of the field effect transistor of Embodiment 1 and the conventional ohmic electrode.
Figure 5B:
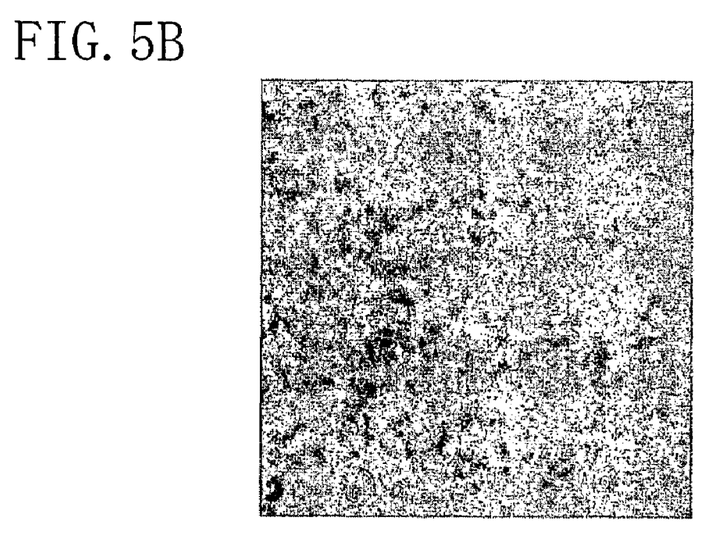

FIGS. 5A and 5B show states of ohmic electrodes observed with an optical microscope. FIG. 5A is a photograph of the non-alloy ohmic electrode of this embodiment and FIG. 5B is a photograph of an ohmic electrode having been subjected to the alloy processing. It is noted that each of the observed ohmic electrodes is made of a layered structure of Ti and Al. As shown in FIG. 5B, the surface of the ohmic electrode is thermally roughened when the alloy processing is performed. On the other hand, as shown in FIG. 5A, the ohmic electrode of this embodiment not subjected to the alloy processing has a smooth surface, and thus, the non-alloy ohmic electrode is different from the conventional ohmic electrode subjected to the alloy processing also in their shapes.

In this embodiment, an electrode that is not subjected to the annealing after the formation, namely, a non-alloy electrode, is used as the ohmic electrode. Therefore, interdiffusion, an 120 interfacial reaction or the like can be prevented from being thermally caused between the material for the capping layer 25 and the material for the source electrode 31 and the drain electrode 32. Accordingly, an intermediate layer, which otherwise increases contact resistance, is not formed between the capping layer 25 and the source electrode 31 or the drain electrode 32, and hence, the contact resistance of the ohmic electrode can be further suppressed. Also, since there is no need to perform the alloy processing, the fabrication process can be simplified.

Modification of Embodiment 1

In Embodiment 1, the ohmic electrode is made of Ti and Al and the Schottky electrode is made of Pd. However, as shown in FIG. 2A, when the capping layer 25 is made of $In_{0.09}Al_{0.32}Ga_{0.59}N$ with large electron affinity, a good ohmic electrode can be formed even by using a material other than the layered structure of Ti and Al.

In an FET of this modification, a source electrode 31 and a drain electrode 32 corresponding to the ohmic electrodes are made of Pd the same as that used for a gate electrode 33. However, since a capping layer 25 is made of $In_{0.09}Al_{0.32}Ga_{0.59}N$ with large electron affinity, good ohmic contacts can be obtained even when Pd with a large work function is thus used. The actually measured contact resistance of the source electrode 31 and the drain electrode 32 has a comparatively small value at a level of $10^{-5}$ $\Omega cm^2$.

In this manner, when the ohmic electrode is made of the same material as the Schottky electrode, there is no need to perform the alloy processing as well as the fabrication process can be further simplified.

Figure 6A:
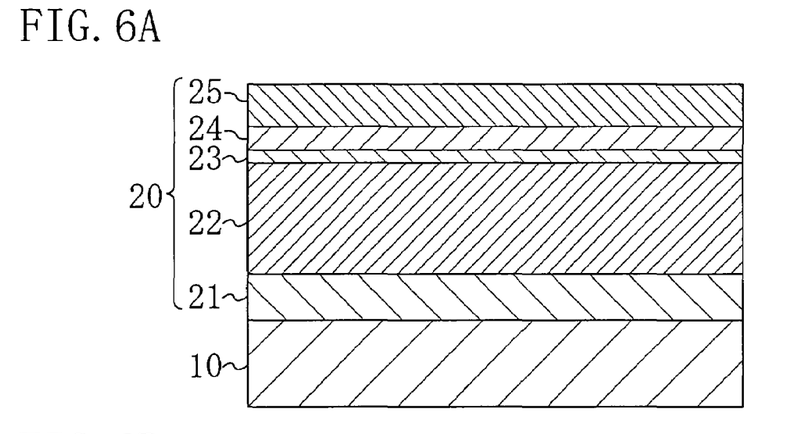
FIGS. 6A, 6B and 6C are cross-sectional views for showing procedures in a method for fabricating a field effect transistor according to a modification of Embodiment 1 of the invention.
Figure 6B:
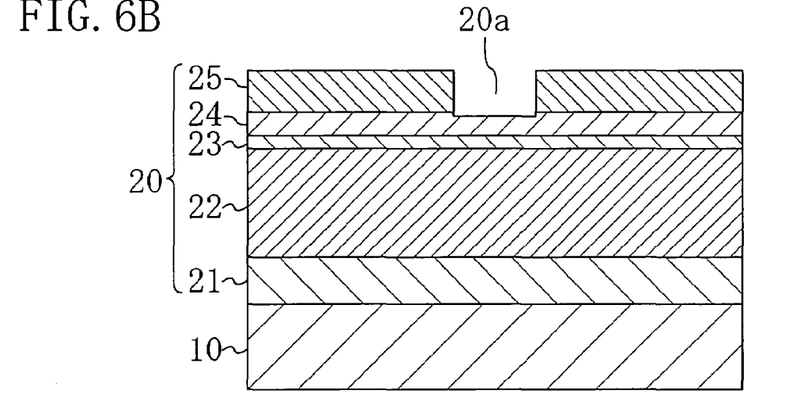
Figure 6C:
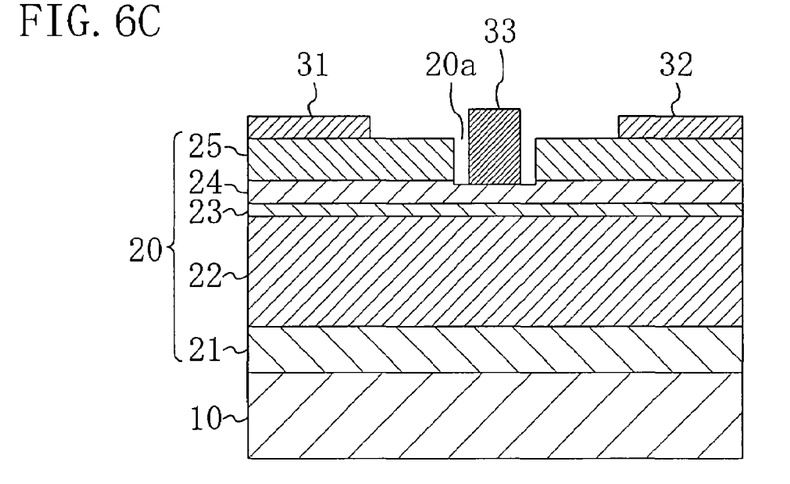

Now, a method for fabricating the FET of this modification will be described with reference to the accompanying drawings. FIGS. 6A through 6C are cross-sectional views for showing procedures for fabricating the FET of this modification. First, as shown in FIG. 6A, a layered structure of nitride semiconductors 20 is formed by successively forming an AlN buffer layer 21 made of undoped AlN with a thickness of 0.5 μm, a GaN buffer layer 22 made of undoped GaN with a thickness of 2 μm, a spacer layer 23 made of AlN with a thickness of 1 nm, an electron supplying layer 24 made of n-type $Al_{0.26}Ga_{0.74}N$ with a thickness of 25 nm and a capping layer 25 made of n-type $In_{0.09}Al_{0.32}Ga_{0.59}N$ with a thickness of 50 nm on a substrate 10 made of sapphire having the (0001) plane of the plane direction as a principal plane by metal organic chemical vapor deposition (MOCVD).

In forming the layered structure of nitride semiconductors 20, the n-type layers are doped with Si, that is, an n-type impurity, by using a $SiH_4$ gas. The impurity concentration is $4 \times 10^{18}$ $cm^{-3}$ in the electron supplying layer 24 and $1 \times 10^{19}$ $cm^{-3}$ in the capping layer 25. It is noted that the impurity concentration in the capping layer 25 may be varied to be higher in an upper portion thereof than in a lower portion thereof. Thus, the contact resistance can be further reduced. Also, a multilayered film including a GaN layer and an AlGaN layer alternately stacked may be formed between the capping layer 25 and the electron supplying layer 24.

Next, as shown in FIG. 6B, a photoresist (not shown) having a stripe-shaped opening with a width of approximately 3 μm is formed on the capping layer 25. By using this photomask as a mask, inductively coupled plasma (ICP) etching using, for example, a $Cl_2$ gas is performed. Thus, the capping layer 25 is selectively removed, so as to form a gate recess 20a corresponding to an opening for exposing the electron supplying layer 24 therein.

Then, as shown in FIG. 6C, a gate electrode 33 of Pd is formed on the exposed portion of the electron supplying layer 24 within the gate recess 20a, and a source electrode 31 and a drain electrode 32 made of Pd are formed on the capping layer 25 so as to oppose each other with the gate electrode 33 disposed therebetween. The gate electrode 33, the source electrode 31 and the drain electrode 32 are simultaneously formed by, for example, electron beam deposition and lift-off. As described above, since the capping layer 25 is made of n-type InAlGaN, sufficiently low ohmic contact resistance can be obtained without performing the annealing, and hence, the annealing generally performed after forming an ohmic electrode can be omitted.

In this manner, in the FET and the fabrication method for the same of this modification, the annealing can be omitted after forming the ohmic electrodes, and the gate electrode, the source electrode and the drain electrode can be simultaneously formed by using the same material. Therefore, the fabrication process can be further simplified and the cost can be lowered.

Embodiment 2

Figure 7:
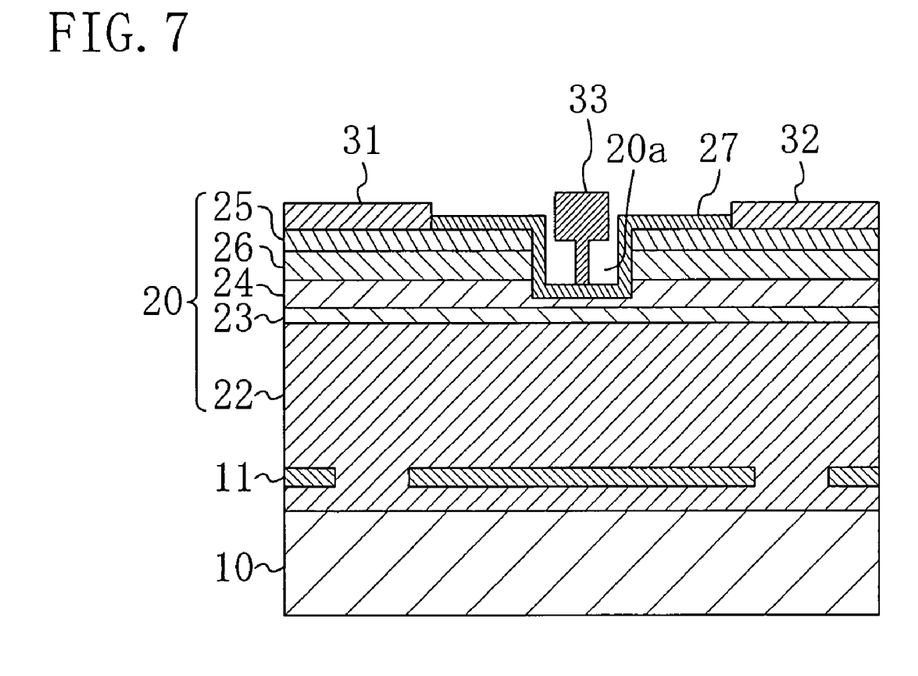
FIG. 7 is a cross-sectional view of a field effect transistor according to Embodiment 2 of the invention.

Embodiment 2 of the invention will now be described with reference to the accompanying drawings. FIG. 7 shows the cross-sectional structure of a field effect transistor (FET) according to Embodiment 2.

As shown in FIG. 7, the FET of this embodiment is a metal insulator semiconductor (MIS) FET having an insulating film between a gate electrode 33 and an electron supplying layer 24.

A layered structure of nitride semiconductors 20 including a capping layer made of InAlGaN is formed on a substrate 10 of sapphire. The layered structure of nitride semiconductors 20 includes a GaN buffer layer 22 made of undoped GaN formed on the substrate 10, a spacer layer 23 made of undoped AlN, the electron supplying layer 24 made of n-type AlGaN, a multilayered film 26 including a GaN layer and the AlGaN layer alternately stacked, and the capping layer 25 made of n-type InAlGaN.

The GaN buffer layer 22 is formed on the substrate 10 by using a $SiO_2$ mask 11 through lateral growth, so as to reduce a dislocation density. A heterojunction interface is formed between the GaN buffer layer 22 and the spacer layer 23, and a two-dimensional electron gas (2DEG) functioning as a channel of the FET is generated in a portion of the GaN buffer layer 22 in the vicinity of the interface with the spacer layer 23. The n-type layers are doped with silicon (Si), that is, an n-type impurity, and the impurity concentration is $4 \times 10^{18}$ $cm^{-3}$ in the electron supplying layer 24 and $1 \times 10^{19}$ $cm^{-3}$ in the capping layer 25. It is noted that the impurity concentration in the capping layer 25 may be varied to be higher in an upper portion thereof than in a lower portion thereof.

A source electrode 31 and a drain electrode 32 both made of a layered structure of Ti and Al are formed to be spaced from each other on the capping layer 25. In a region between the source electrode 31 and the drain electrode 32, the capping layer 25 and the multilayered film 26 are selectively removed, so as to form a gate recess 20a for exposing the electron supplying layer 24 therein. An insulating film 27 made of silicon nitride (SiN) is formed so as to cover portions of the capping layer 25 and the multilayered film 26 corresponding to the wall of the gate recess 20a, a portion of the electron supplying layer 24 exposed in the gate recess 20a and a portion of the capping layer 25 disposed around the gate recess 20a. The gate electrode 33 made of a layered structure of Ti and Al is formed above the portion of the electron supplying layer 24 exposed in the gate recess 20a with the insulating film 27 sandwiched therebetween.

In the FET of this embodiment, the gate electrode, the source electrode and the drain electrode can be formed by using the same material without performing the alloy processing. Furthermore, since the MIS structure is employed, expansion of a depletion layer to a side portion of the gate electrode can be suppressed, and hence, the influence of capacitance on the side portion of the gate electrode can be reduced when the gate length is shortened, what is called a short-channel effect can be suppressed, and transconductance and radio-frequency gain can be improved.

Now, a method for fabricating the FET of this embodiment will be described with reference to the accompanying drawings. FIGS. 8A through 8E are cross-sectional views for showing procedures for fabricating the FET of this embodiment.

Figure 8A:
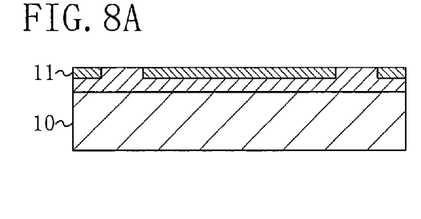
FIGS. 8A, 8B, 8C, 8D and 8E are cross-sectional views for showing procedures in a method for fabricating the field effect transistor of Embodiment 2.

First, as shown in FIG. 8A, an undoped GaN film 22A with a thickness of 500 nm is formed on the (0001) plane of a substrate 10 of, for example, sapphire by the MOCVD. Subsequently, a silicon oxide film (a $SiO_2$ film) is formed in a thickness of approximately 100 nm by CVD using, for example, a $SiH_4$ gas and an $O_2$ gas. The $SiO_2$ film is selectively etched with a hydrofluoric acid (HF) aqueous solution by using a photoresist as a mask, thereby forming a $SiO_2$ mask 11 having openings each with a width of 5 µm formed at an interval of 10 µm. Then, an undoped GaN film is regrown from portions of the undoped GaN film 22A exposed in the openings of the $SiO_2$ mask 11, thereby forming a GaN buffer layer 22 with a thickness of 2 µm. Since the crystal of GaN is grown in the lateral direction so as to cover the $SiO_2$ mask, the through dislocation density is largely reduced in a portion of the GaN buffer layer 22 disposed above the $SiO_2$ mask. As a result, the dislocation density of the GaN buffer layer 22 is at a level of $10^6$ cm$^2$.

Figure 8B:
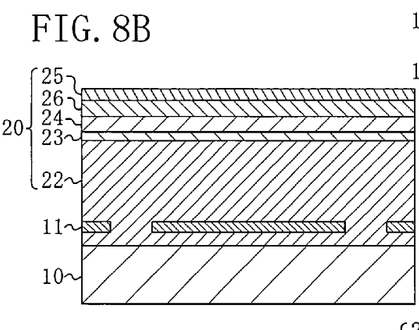

Next, as shown in FIG. 8B, a spacer layer 23 made of AlN with a thickness of 1 nm, an electron supplying layer 24 made of n-type $Al_{0.26}Ga_{0.74}N$ with a thickness of 25 nm, a multilayered film 26 including layers of seven cycles each composed of an n-type GaN thin film with a thickness of 5.6 nm and an n-type AlGaN thin film with a thickness of 1.4 nm alternately stacked, and a capping layer 25 made of n-type $In_{0.09}Al_{0.32}Ga_{0.59}N$ with a thickness of 20 nm are successively formed on the GaN buffer layer 22, so as to form a layered structure of nitride semiconductors 20. In forming the layered structure of nitride semiconductors 20, the n-type layers are doped with Si, that is, an n-type impurity, by using a $SiH_4$ gas. The impurity concentration is $4 \times 10^{18}$ cm$^{-3}$ in the electron supplying layer 24 and $1 \times 10^{19}$ cm$^{-3}$ in the capping layer 25.

Figure 8C:
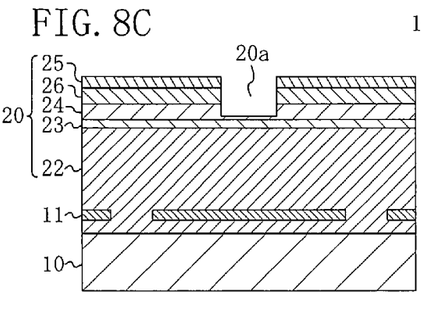

Then, as shown in FIG. 8C, a photoresist (not shown) having a stripe-shaped opening with a width of approximately 3 µm is formed on the capping layer 25. The inductively coupled plasma (ICP) etching using, for example, a $Cl_2$ gas is performed by using the photomask as a mask. Thus, the capping layer 25 and the multilayered film 26 are selectively removed, so as to form a gate recess 20a corresponding to an opening for exposing the electron supplying layer 24 therein. At this point, the electron supplying layer 24 is selectively removed by a depth of 5 nm from the surface thereof in the opening.

Figure 8D:
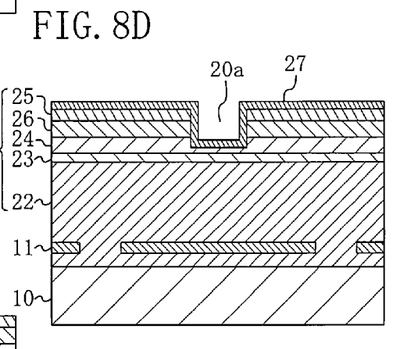

Next, as shown in FIG. 8D, an insulating film 27 made of SiN with a thickness of 5 nm is formed by the CVD using a $SiH_4$ gas and a $NH_3$ gas so as to cover a portion of the electron supplying layer 24 exposed in the gate recess 20a, the wall of the gate recess 20a and the capping layer 25. When the portion of the electron supplying layer 24 exposed in the gate recess 20a is etched to reduce its thickness and the thickness of a portion of the insulating film 27 formed on the electron supplying layer 24 is smaller than the etching depth of the electron supplying layer 24, the mutual conductance can be increased, so that device characteristics including the radio-frequency characteristic can be improved.

Figure 8E:
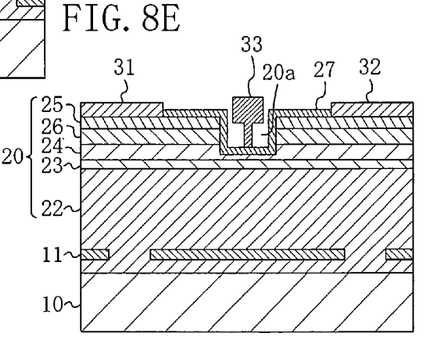

Ultimately, as shown in FIG. 8E, a portion of the insulating film 27 disposed on the capping layer 25 is selectively removed by reactive ion etching (RIE) using, for example, a $CF_4$ gas and an $O_2$ gas with a photoresist used as a mask, thereby exposing the capping layer 25. Next, a source electrode 31 and a drain electrode 32 are simultaneously formed on the exposed portion of the capping layer 25, and a gate electrode 33 is formed on a portion of the insulating film 27 formed in the gate recess 20a. The source electrode 31, the drain electrode 32 and the gate electrode 33 are made of Ti and Al and may be formed by the electron beam deposition and the lift-off.

The gate electrode 33 is preferably formed in a shape having an upper portion thereof wider than a lower portion thereof, namely, formed as a T-shaped electrode. In this manner, the gate electrode resistance is reduced and the radio-frequency characteristic is improved.

Also, since the capping layer made of n-type InAlGaN is used, an ohmic electrode with sufficiently low contact resistance can be formed without performing the annealing, and hence, there is no need to perform the annealing generally performed after forming an ohmic electrode.

Although the insulating film 27 is made of SiN in this embodiment, the material for the insulating film 27 is not particularly specified as far as it has an insulating property, and silicon oxide ($SiO_2$), tantalum oxide ($Ta_2O_5$), hafnium oxide ($HfO_2$), aluminum nitride (AlN) or the like may be used instead. Furthermore, although the multilayered film 26 is formed between the capping layer 25 and the electron supplying layer 24 for further reducing the contact resistance of the ohmic electrodes, the multilayered film 26 may be omitted.

Moreover, although the source electrode and the drain electrode are made of the same material as that used for the gate electrode in this embodiment, different materials may be used as in Embodiment 1.

In each of the embodiments and the modification described above, although the substrate 10 is a sapphire substrate having the (0001) plane as the plane direction of the principal plane, the plane direction of the principal plane is not particularly specified and may be a plane direction off-angled from a representative plane. Furthermore, a substrate made of silicon carbide (SiC), zinc oxide (ZnO), zirconium boride ($ZrB_2$), silicon (Si), gallium arsenide (GaAs), gallium phosphide (GaP), indium phosphide (InP), lithium gallium oxide ($LiGaO_2$), lithium aluminum oxide ($LiAlO_2$) or a mixed crystal of any of them may be used instead.

With respect to the compositions of the respective layers of the layered structure of nitride semiconductors, the ratios of the components may be modified as far as desired device characteristics can be attained, or the layered structure of the nitride semiconductors may be arbitrarily modified. Furthermore, the layered structure of nitride semiconductors may include, as a composing element, a group V element such as arsenic (As) or phosphorous (P) or a group III element such as boron (B). The layered structure of nitride semiconductors may be grown by molecular beam epitaxy (MBE), a hydride vapor phase epitaxy (HVPE) or the like instead of the MOCVD. Alternatively, the same effects can be attained by using a GaAs-based or InP-based semiconductor instead of the GaN-based semiconductor.

The materials of the electrodes mentioned in each of the embodiments and the modification described above are merely examples and are not restrictive, and other materials may be used for the ohmic electrodes and the Schottky electrode. Moreover, in order to reduce resistance caused in connecting a wire to an electrode, a metal material such as gold may be further stacked on the ohmic electrodes and the Schottky electrode.

As described so far, in the field effect transistor of this invention, the contact resistance of the source electrode and the drain electrode is reduced without performing the alloy processing and the electrodes can be easily formed. Therefore, the invention is useful as a field effect transistor particularly usable as a high-power radio-frequency transistor and a method for fabricating the same.

What is claimed is:

1. A field effect transistor comprising:
   a layered structure of nitride semiconductors formed on a substrate and including a capping layer made of a compound represented by a general formula of $In_xAl_yGa_{1-y}N$ (wherein $0<x\leqq1$, $0\leqq y<1$ and $0<x+y\leqq1$);
   a non-alloy source electrode and a non-alloy drain electrode formed directly on said capping layer and spaced from each other; and
   a gate electrode,
   wherein said layered structure of nitride semiconductors includes an electron supplying layer formed under said capping layer,
   said capping layer has an opening formed in a region between said source electrode and said drain electrode for exposing said electron supplying layer therein,
   said gate electrode is formed on a portion of said electron supplying layer exposed in said opening, and
   said gate electrode, said source electrode and said drain electrode are made of the same material.

2. The field effect transistor of claim 1, further comprising an insulating film formed between said gate electrode and said electron supplying layer.

3. The field effect transistor of claim 1, wherein said layered structure of nitride semiconductors includes a multilayered film that is formed between said capping layer and said electron supplying layer and includes gallium nitride and aluminum gallium nitride alternately stacked.

4. The field effect transistor of claim 1, wherein said capping layer includes indium, aluminum and gallium in a ratio which satisfies the lattice-matching condition with gallium nitride.

5. The field effect transistor of claim 4, wherein a value extracted from a ratio of aluminum in said capping layer divided by a ratio of indium in said capping layer is not smaller than approximately 3.6 and not larger than approximately 4.7.

6. The field effect transistor of claim 1, wherein each of said source electrode, said drain electrode and said gate electrode is made of a layered structure including at least one of or two or more of aluminum, titanium, molybdenum, copper and palladium.

7. The field effect transistor of claim 1, wherein each of said source electrode and said drain electrode has contact resistance of approximately $1\times10^{-4}$ $\Omega cm^2$ or less.

8. The field effect transistor of claim 1, wherein said capping layer includes an impurity in a concentration of approximately $1\times10^{19}$ $cm^{-3}$ or more.

* * * * *